United States Patent [19]

Sechi et al.

[11] Patent Number: 4,697,159

[45] Date of Patent: Sep. 29, 1987

[54] TUNING CAPACITORS WITH SELECTABLE CAPACITANCE CONFIGURATIONS FOR COUPLING BETWEEN MICROWAVE CIRCUITS

[75] Inventors: Franco N. Sechi, Princeton; David Kalokitis, Hamilton Township, Mercer County, both of N.J.

[73] Assignee: RCA Corporation, Princeton, N.J.

[21] Appl. No.: 666,811

[22] Filed: Oct. 31, 1984

[51] Int. Cl.[4] ............................................. H01P 5/04
[52] U.S. Cl. ................................. 333/24 C; 361/278; 361/328; 361/329; 361/402
[58] Field of Search ................... 334/45, 55, 78, 82; 361/277, 278, 271, 303, 309, 310, 312, 402, 328, 329; 333/246, 238, 204, 24 C

[56] References Cited

U.S. PATENT DOCUMENTS

| | | | |
|---|---|---|---|
| 2,891,428 | 1/1959 | Shen | 361/306 X |
| 3,234,442 | 2/1966 | Maissel et al. | 361/328 |
| 3,264,537 | 8/1966 | Delaney et al. | 361/312 |
| 3,273,033 | 9/1966 | Rossmeisl | 361/329 X |
| 3,490,055 | 1/1970 | Cox | 361/402 X |
| 3,573,675 | 4/1971 | Leonard | 333/204 X |
| 3,900,773 | 8/1975 | Bowkley | 361/303 |
| 4,110,715 | 8/1978 | Reindel | 333/204 |
| 4,114,120 | 9/1978 | Lupfer | 333/246 |
| 4,296,272 | 10/1981 | Schelhorn | 361/402 X |
| 4,376,329 | 3/1983 | Behn et al. | 361/309 X |
| 4,470,096 | 9/1984 | Guertin | 361/277 |
| 4,561,039 | 12/1985 | Tsukahara | 361/328 |

FOREIGN PATENT DOCUMENTS

| | | | |
|---|---|---|---|
| 1349047 | 3/1974 | United Kingdom | 333/238 |
| 1121703 | 10/1984 | U.S.S.R. | 361/271 |

*Primary Examiner*—Eugene R. LaRoche
*Assistant Examiner*—Benny T. Lee
*Attorney, Agent, or Firm*—Allen L. Limberg; Henry I. Steckler; Raymond E. Smiley

[57] ABSTRACT

A tuning capacitor arrangement for a microwave circuit including, on a substrate, first and second conductors to be capacitively joined. The tuning capacitor arrangement includes first and second capacitors each having connective tabs terminating on the substrate in the space between the first and second conductors. One or more connective pieces electrically connect one or more tabs to the conductors to determine the total capacitance between the first and second conductors.

4 Claims, 6 Drawing Figures

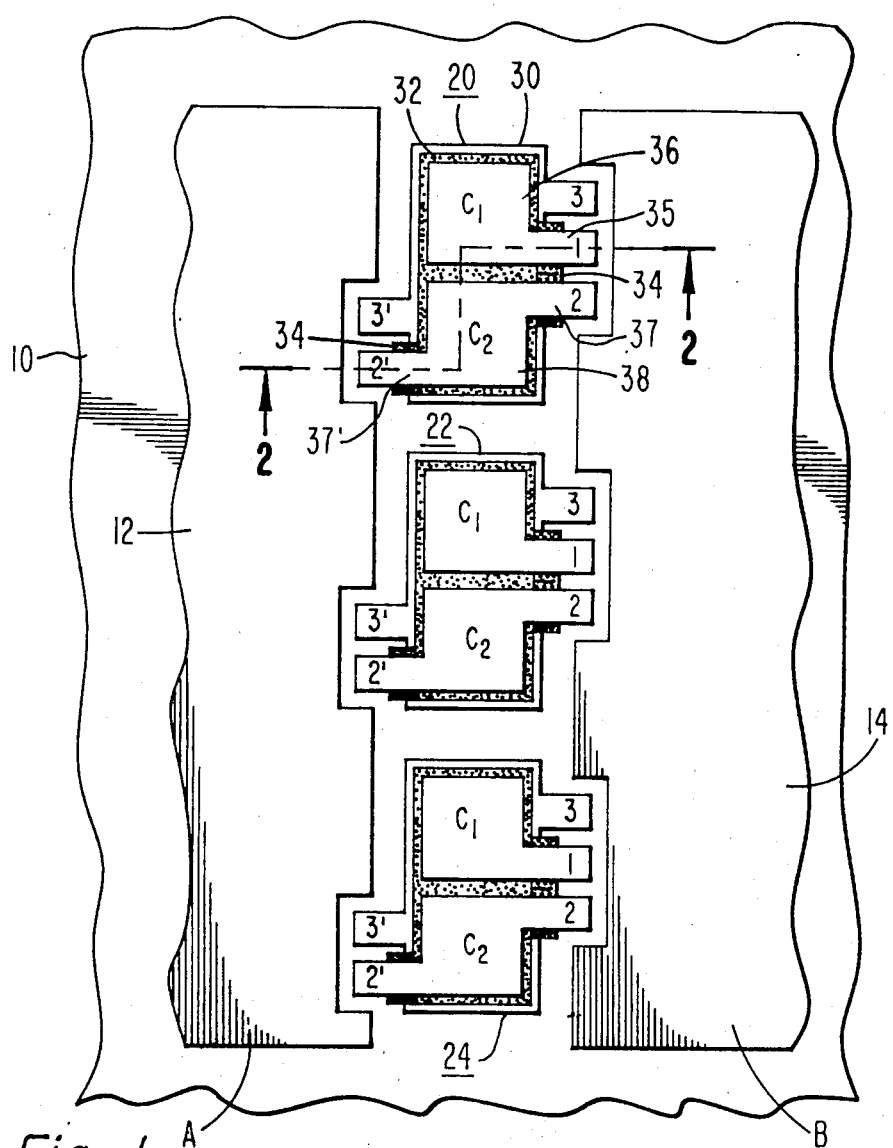
Fig. 1
Fig. 2
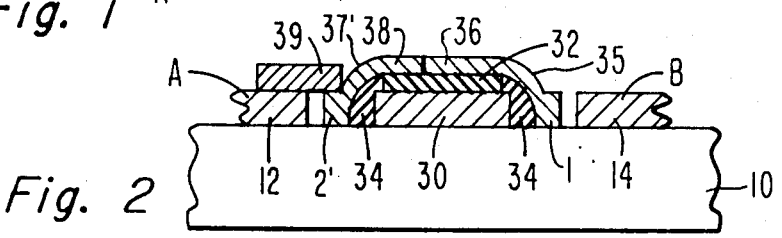
| CONNECTION | | | TOTAL CAPACITANCE |
|---|---|---|---|
| 1-B | 2'-A | | $C_1 C_2/(C_1+C_2)$ |
| 1-B | 3'-A | | $C_1$ |
| 2-B | 3'-A | | $C_2$ |
| 1-B | 2-B | 3'-A | $C_1+C_2$ |
Fig. 3

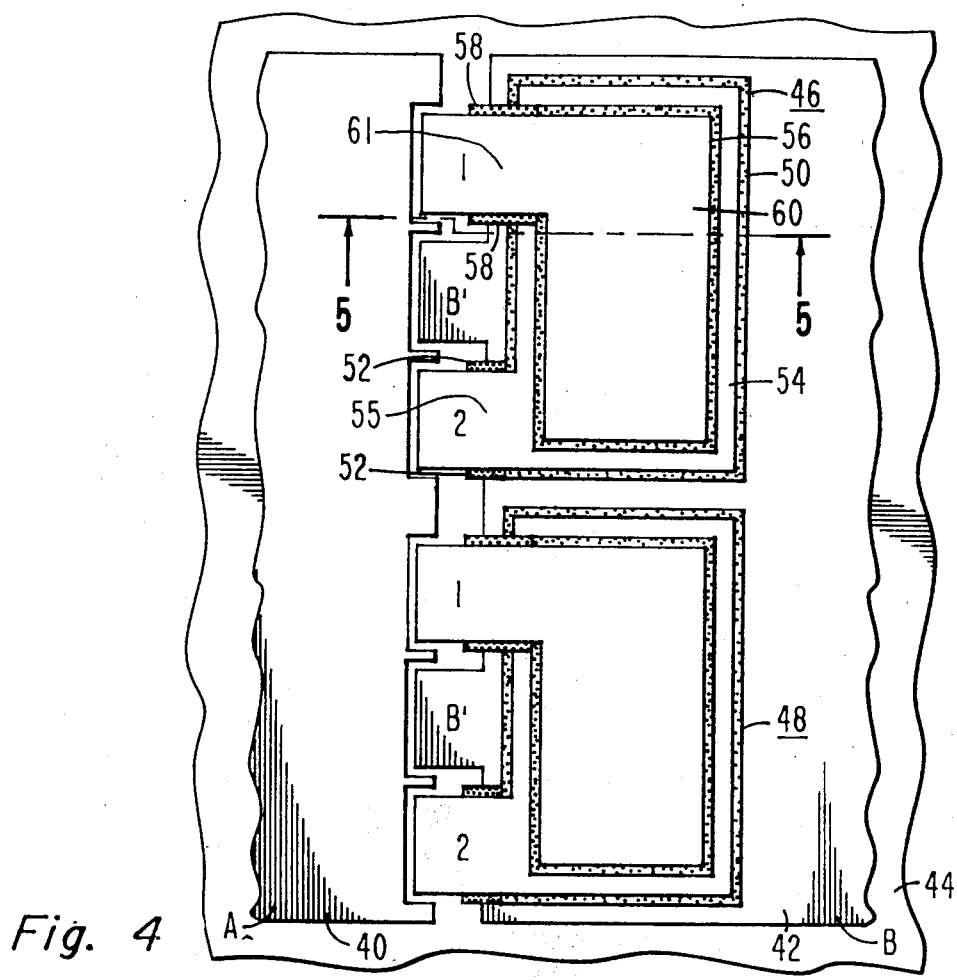
Fig. 4
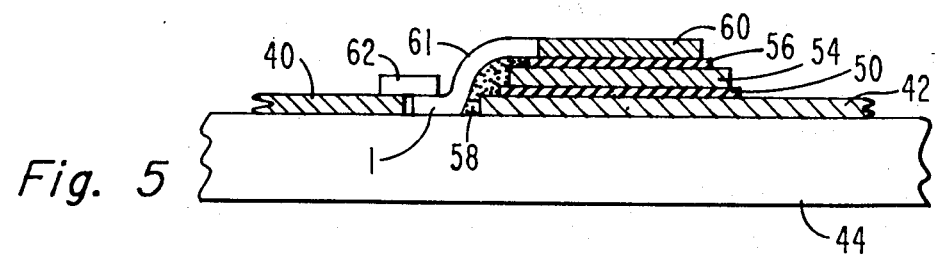
Fig. 5
| CONNECTION | TOTAL CAPACITANCE |
|---|---|
| 1-A | $C_1C_2/(C_1+C_2)$ |
| 1-A 2-B' | $C_1$ |
| 2-A | $C_2$ |
| 1-B' 2-A | $C_1+C_2$ |
Fig. 6

TUNING CAPACITORS WITH SELECTABLE CAPACITANCE CONFIGURATIONS FOR COUPLING BETWEEN MICROWAVE CIRCUITS

BACKGROUND OF INVENTION

1. Field of Invention

This invention is concerned with adjustable value tuning capacitors for microwave circuits, and more particularly to circuits which can easily be interconnected to achieve any desired one of a plurality of capacitance values.

2. Description of the Prior Art

One of the most effective tuning techniques for a class of miniature microwave circuits that are constructed by means of lumped elements is to vary the bonding configuration of isolated capacitors. The desired effect is achieved either or both of selecting the location of the bonds, which effectively varies the electrical length of the circuit, or by selecting the number of bonds, which effectively varies the total capacitance connected into the circuit. It is common to have an array of differently valued capacitors fabricated near the facing edges of the two circuit conductor electrodes to be capacitively joined. The capacitors are fabricated with dielectric pieces positioned atop one or both electrodes and electrodes positioned on each dielectric piece. Where the capacitors are only on one electrode, an interconnecting wire bond is positioned between a selected capacitor and the opposite circuit conductor electrode. Where the capacitors are on both electrodes, an interconnecting wire bond is connected between a selected capacitor on one circuit conductor electrode and a selected capacitor on the opposite circuit conductor electrode. Tuning achieved by bonding multiple capacitors, while theoretically possible, is not practical because of the excess parasitics produced by the wire bonds.

The main problems with the prior art are: (a) the bonding over the top electrodes stresses the dielectric film often causing the capacitor to fail; (b) the tuning is very time consuming since each change in tuning configuration requires the removal of the circuit from the measurement setup and often also from holding fixtures and its placement into a bonding machine; and (c) bond wires introduce undesired electrical characteristics which are not well controlled and vary from circuit to circuit

SUMMARY OF THE INVENTION

In accordance with a preferred embodiment of the present invention, on a microwave circuit comprising an insulating substrate and first and second separated conductors to be capacitively joined where the upper surfaces of the first and second conductors are in a plane, a tuning capacitor arrangement comprises first and second capacitors having conductive tabs terminating on the substrate in the space between the first and second conductors such that the upper surfaces of the tabs lie in the plane and one or more conductive means electrically connecting selected ones of the tabs to the first and second conductors to determine the total capacitance between the first and second conductors.

BRIEF DESCRIPTION OF THE DRAWINGS

FIG. 1 is a plan view of a first tuning capacitor arrangement on a microwave circuit including two conductors to be capacitively joined;

FIG. 2 is an elevation section view along lines 2—2 of FIG. 1;

FIG. 3 is a table of the various values that the capacitors of FIG. 1 may be configured to assume;

FIG. 4 is a plan view of a second tuning capacitor arrangement on a microwave circuit including two conductors to be capacitively joined;

FIG. 5 is an elevation section view along lines 5—5 of FIG. 4; and

FIG. 6 is a table of the various values that the capacitors of FIG. 4 may assume.

DETAILED DESCRIPTION

Referring now to FIG. 1 there is illustrated a portion of a microwave circuit fabricated in monolithic form on a suitable substrate material such as glazed beryllium oxide (BeO) 10, illustrated broken away. The glazed BeO is fabricated as described in U.S. Pat. No. 4,376,287 issued Mar. 8, 1983 to the instant applicant. It will be understood that a typical microwave circuit of the type utilizing the present invention will typically have a large amount of other monolithic circuitry and non-monolithically added active devices. Thus, what is illustrated in FIG. 1 is two broken away conductors 12 and 14, respectively (also designated A and B, respectively) which are to be capacitively joined.

In FIG. 1 an array of three tuning capacitor arrangements 20, 22 and 24 in accordance with one preferred embodiment of the present invention is illustrated. In practice an array of perhaps four such tuning capacitor arrangements is exemplary. Because of the very small size of conductors 12 and 14, the size of each capacitor arrangement must also be small. Since all of the tuning capacitor arrangements are identical, a description of tuning capacitor arrangement 20 will be given.

Capacitor arrangement 20 consists of a first conductive layer 30 fabricated at the same time and by the same technique as that utilized to fabricate conductors 12 and 14. A typical thickness of conductors 12, 14 and 30 is 3 micrometers. Conductor 30 is generally rectangular but has two protruding tabs 3 and 3', the purpose of which will be explained later. A dielectric film 32 is then fabricated on layer 30. Referring next to FIG. 2, which is a cross section of a tuning capacitor arrangement such as along lines 2—2 of tuning capacitor arrangement 20, a supporting insulating material 34, which insulates the capacitor arrangement 20 top conductive layer (to be described hereinafter) from conductor 30 is applied. One exemplary insulating material is polyimide. After insulating material 34 is applied, a plurality of generally rectangular or square conductors such as conductors 36 and 38, respectively, (also designated $C_1$ and $C_2$) are fabricated on dielectric 32. The thickness of conductors 36 and 38 is typically identical to that of conductors 12, 14 and 30 or about 3 micrometers. Conductor 36 has one "bridge" legended 35 which extends from the rectangular part of conductor 36 to substate 10 including and terminating in a tab 1 disposed on the substrate. Tab 1 extends toward but is separated from conductor 14 such that the upper surface of tab 1 is in the same plane as that of conductors 12, 14 and 30. The insulating material 34 ensures that bridge 35 does not touch conductor 30.

Conductor 38 is fabricated in a similar manner to that of conductor 36 and includes two bridges 37 and 37' extending toward conductors 14 and 12, respectively. Again the upper surface of the terminating tabs 2 and 2' of bridges 37 and 37' lie in the same plane as the upper surfaces of conductors 12 and 14 and insulating material 34 ensures that bridges 37 and 37' will not come in contact with conductor 30. See FIG. 2.

In operation, typically one of tuning capacitor arrangments 20, 22 and 24 is utilized to capacitively interconnect conductors 12 and 14. The amount of capacitance is determined by which of tabs 1, 2, 2', 3 and 3' are connected together or to conductors 12 and 14. The amount of capacitance desired and the particular location of the tuning capacitor arrangement relative to conductors 12 and 14 is determined, at least for the first few tested circuits, by trial and error. It is therefore important that electrical interconnection between the various bridges and conductors be easily made and removed to determine that best operating characteristic. Because the upper surface of the various tabs all terminate at the same level as the upper surface of conductors 12 and 14, it is easy to connect simply a short length of conductor between any two tabs or any tab and conductor.

In FIG. 2 an exemplary conductive strip 39 connects conductor 12 with tab 2'. Once the particular tuning capacitor arrangement of the typically four tuning capacitor arrangements is chosen, the particular interconnection of the tabs and conductors determines the amount of total capacitance. The table of FIG. 3 in two columns illustrates the interconnections and the value of capacitance thereby effected. The left column indicates the connection by means of strips such as 39 and the right column indicates the capacitance resulting therefrom. For example, if the bridge 35 tab 1 is connected to conductor B by means of a strip such as 39 and the tab 3' is connected to conductor A, the total capacitance is $C_1$ (the capacitance from conductor 36 to conductor 30). Similarly, if the bridge 37 tab 2 is connected to conductor B and the tab 3' is connected to conductor A, the resulting capacitance is $C_2$ (the capacitance from conductor 38 to conductor 30). Two other interconnections result in two other values of capacitance.

Thus, depending on the interconnection, any of four capacitance values may be realized. By a proper choice of values of the various capacitors, a constant capacitance ratio between two successive values and thus a geometric progression can be achieved from a relatively low value of capacitance represented by the first line of FIG. 3 to a relatively high value of capacitance represented by the bottom line of FIG. 3. This condition is mathematically expressed by:

$$C_1/[C_1C_2/(C_1+C_2)] = C_2/C_1 = (C_1+C_2)/C_2$$

which is physically realizable only for:

$$C_2/C_1 = (1+\sqrt{5})/2 = 1.6$$

Different valued capacitors are most easily achieved by choosing conductive areas 36 and 38 to be of different sizes (e.g., 1:1.6).

There are situations in which not enough space is available on a circuit board to permit the tuning capacitors to be separately positioned directly on the substrate material. Where "real estate" on the substrate material is not available, a substitution is to fabricate the variable tuning capacitors on top of one of two conductors to be capacitively joined. This arrangement is illustrated in FIG. 4 to which attention is now directed.

In FIg. 4 conductors 40 and 42, respectively (also legended A and B, respectively) are fabricated atop a suitable substrate material 44 shown broken away in FIG. 4. The substrate material may be glazed BeO as discussed previously in connection with FIG. 1. An array of tuning capacitor arrangements is positioned atop one of the two conductors, for example, conductor 42. Two tuning capacitor arrangements 46 and 48 are illustrated although in principle a typical number of such tuning capacitor arrangements would be four. Conductor 42 includes a tab B' associated with each tuning capacitor arrangement for purposes to be discussed below.

Since both tuning capacitor arrangements 46 and 48 are identical, a description will be given only of tuning capacitor arrangement 46. A dielectric film 50 is fabricated on conductor 42 at a location near to conductor 40. An insulating material 52, FIG. 4, similar to material 34, FIG. 2, extends from a position level with dielectric 50, over conductor 42, down to substrate 44. Next a conductor area 54 is fabricated on dielectric 50 with a bridge portion 55 extending over insulator 52 and including a terminating tab 2 lying on to substrate 44 the bridge being thus insulated from conductor 42, such that the upper surface of the tab lies in the same plane as the upper surface of conductor 40 and terminates near conductor 40.

Next a dielectric layer 56 is fabricated on conductor 54, then an insulating material 58, similar to material 34, FIG. 2, is fabricated over conductors 42 and 54 from a position touching and level with the top of dielectric 56 tapering down to substrate 44. Insulating material 58 is illustrated in the cross section view of FIG. 5, which is a cross section view along lines 5—5, FIG. 4. Then a conductor 60 is fabricated on dielectric 56 with a bridge portion 61 extending over insulator 58 and including a terminating tab 2 such that the bridge is insulated from conductors 42 and 54 and such that the upper surface of tab 2 is level with the upper surface of conductor 40.

As with the circuit of FIG. 1, the particular tuning capacitor arrangement to be utilized is chosen by selecting the required connection in accordance with FIG. 6, which is a table illustrating the various possible connections between the bridges and tabs and conductors and the capacitive value provided thereby.

Thus, by way of example, with tab 1 electrically connected to conductor A the total capacitance is $C_1C_2/(C_1+C_2)$ where $C_1$ represents the capacitance between conductor 60 and conductor 54 and $C_2$ represents the capacitance between conductor 54 and conductor 42. With a conductive strip 62 connecting tab 1 to conductor A and a second conductive strip (not shown) connecting bridge 2 to tab portion B' of conductor B, the total capacitance is $C_1$. As illustrated in the table of FIG. 6 with the arrangement illustrated in FIG. 4 there are four possible values of capacitance. By a proper design choice of the dielectric layers 50 and 56 and/or different sizes of conductors 54 and 60 different values of capacitance for capacitors $C_1$ and $C_2$ are created.

It should be understood that in the description of FIGS. 1 and 4 that references to top and bottom and the like are only relative terms. Clearly the substrate 44 could be on top and the various dielectric layers and conductors could be placed beneath substrate 44. Also, although the invention may be practiced utilizing monolithic technology and thin film technology and is preferably done using these technologies, the variable tuning capacitor arrangements described could be fabricated using other technologies.

What is claimed is:

1. In a microwave circuit comprising an insulating substrate and first and second separated conductors comprising upper and lower surfaces respectively, said lower surfaces being disposed on one surface of said substrate to be capacitively joined, where the upper surfaces of said first and second conductors are in a common plane, a tuning capacitor arrangement comprising in combination:
   a first dielectric material layer fabricated atop one of said first and second conductors near to the other of said conductors;
   a first conductive area fabricated atop said dielectric layer, the conductive area including at least one conductive bridge extending to a position on said substrate so as to form a tab thereon insulated from said first and second conductors, said tab having a lower surface and an upper surface, such that said upper surface of the tab lies in said common plane and said lower surface lies on said one surface of said substrate;
   a second dielectric material layer fabricated atop said first conductive area;
   a second conductive area fabricated atop said second dielectric material, said second conductive area including at least one conductive bridge extending to a position on said substrate so as to form a tab thereon insulated from said first and second conductors and first conductive area tab, said tab of said second conductive area having a lower surface and an upper surface, such that the upper surface of said tab lies in said common plane and said lower surface lies on said one surface of said substrate; and
   one or more conductive means connecting selected ones of said tabs and the other of said first and second conductors to determine the total capacitance between said first and second conductors.

2. The combination as set forth in claim 1 and further including a plurality of tuning capacitor arrangements, all similar to said tuning capacitor arrangement, all located atop said one of said first and second conductors.

3. The combination as set forth in claim 1 wherein said first and second conductive areas are of different physical dimensions from one another.

4. The combination as set forth in claim 3 further including, for each conductive bridge, an insulative material is disposed beneath said bridge.

* * * * *